United States Patent
Hara et al.

(10) Patent No.: US 9,478,452 B2
(45) Date of Patent: Oct. 25, 2016

(54) SMALL PRODUCTION DEVICE AND PRODUCTION SYSTEM USING THE SAME

(71) Applicant: NATIONAL INSTITUTE OF ADVANCED INDUSTRIAL SCIENCE AND TECHNOLOGY, Tokyo (JP)

(72) Inventors: Shiro Hara, Tsukuba (JP); Hitoshi Maekawa, Tsukuba (JP); Shizuka Nakano, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/768,352
(22) PCT Filed: Feb. 17, 2014
(86) PCT No.: PCT/JP2014/053617
§ 371 (c)(1),
(2) Date: Aug. 17, 2015
(87) PCT Pub. No.: WO2014/129421
PCT Pub. Date: Aug. 28, 2014

(65) Prior Publication Data
US 2015/0380289 A1 Dec. 31, 2015

(30) Foreign Application Priority Data
Feb. 20, 2013 (JP) .................................. 2013-030596

(51) Int. Cl.
*H01L 21/677* (2006.01)
*H01L 21/67* (2006.01)
(52) U.S. Cl.
CPC ... *H01L 21/67778* (2013.01); *H01L 21/67155* (2013.01); *H01L 21/67739* (2013.01)
(58) Field of Classification Search
None
See application file for complete search history.

(56) References Cited

U.S. PATENT DOCUMENTS

| 7,974,726 B2 * | 7/2011 | Rothe ............... H01L 21/67294 414/222.02 |
| 8,988,244 B2 * | 3/2015 | Yagawa ............... B65G 1/0421 187/286 |

(Continued)

FOREIGN PATENT DOCUMENTS

| JP | 10-112489 | 4/1998 |
| JP | 2006-5086 | 1/2006 |
| JP | 2011-181771 | 9/2011 |

OTHER PUBLICATIONS

International Search Report mailed Apr. 15, 2014, in corresponding International Patent Application No. PCT/JP2014/053617.

*Primary Examiner* — Ryan Jarrett
(74) *Attorney, Agent, or Firm* — Staas & Halsey LLP

(57) ABSTRACT

A production system to facilitate the commonization of front chambers among a plurality of production devices that are different in the kind of a process to be performed for a processing substrate.
Control units are provided separately in a processing chamber and a front chamber of a small production device. When the processing-chamber control unit outputs a load request signal, the front-chamber control unit loads a processing substrate to the processing chamber, and outputs a load acknowledgment signal. When the load acknowledgment signal is input, the processing-chamber control unit performs a process for the processing substrate, and outputs an unload request signal after the completion of the process. When the unload request signal is input, the front-chamber control unit unloads the processing substrate, and outputs an unload acknowledgment signal. When the unload acknowledgment signal is input, the processing chamber starts the preparation of the next process.

3 Claims, 6 Drawing Sheets

(56) References Cited

U.S. PATENT DOCUMENTS 9,086,697 B2 * 7/2015 Suzuki

2002/0045967 A1 * 4/2002 Nakano ............ H01L 21/67276
                                                              700/121
2011/0218659 A1    9/2011 Nomura

* cited by examiner

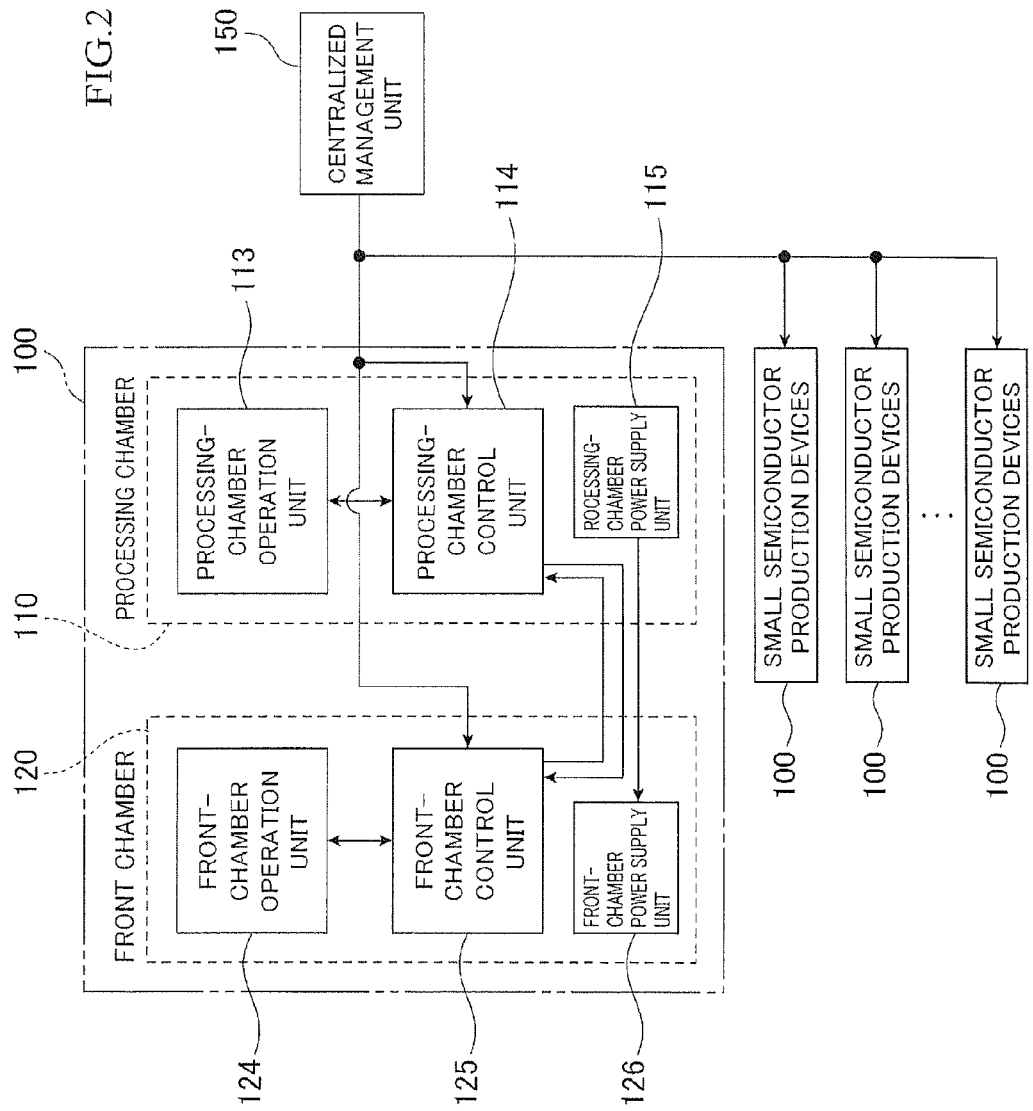

SMALL PRODUCTION DEVICE AND PRODUCTION SYSTEM USING THE SAME

TECHNICAL FIELD

The invention relates to a small production device that is used in a process of producing a device (a semiconductor device or the like) using a processing substrate (for example, a semiconductor wafer or the like), and a production system using the same.

BACKGROUND ART

A conventional production device will be described, taking as an example a production system that is used in a semiconductor production process.

As the conventional semiconductor production devices, for example, a semiconductor manufacturing devices described in Japanese Patent Laid-Open No. 2006-5086 described below is known.

In the semiconductor manufacturing devices described in Patent Literature 1, vacuum lock chambers (front chambers) VL1, VL2 are provided for process chambers (substrate processing chambers) PM1, PM2, respectively. Between the process chambers PM1, PM2 and the vacuum lock chambers VL1, VL2, gate valves G1, G2 are provided. Then, by vacuum robots VR1, VR2 disposed in the vacuum lock chambers VL1, VL2, the loading and unloading of a wafer W are performed between the process chambers PM1, PM2 and the vacuum lock chambers VL1, VL2 (see FIG. 1, etc. in Japanese Patent Laid-Open No. 2006-5086).

In this semiconductor production devices, one control means CNT comprehensively performs a control of making the vacuum robots VR1, VR2 perform the loading and unloading of the wafer W, a control of performing a predetermined processings for the wafer W in the process chambers PM1, PM2, and the like (see Paragraph [0043], etc. in Japanese Patent Laid-Open No. 2006-5086).

SUMMARY OF INVENTION

Technical Problem

In recent years, a demand for the high-mix low-volume production of semiconductor devices has increased. Further, in the case where a semiconductor device is experimentally produced in research and development or the like, it is demanded to produce the semiconductor device in units of one or several devices.

Further, as described above, in the case where an identical type of product is produced in high volume at a large-scale factory, it is very difficult to regulate the production volume in response to the demand fluctuation in the market. This is because, in a low-volume production, it is impossible to secure the profit matching with the operating cost for the factory. Furthermore, semiconductor manufacturing factories require a high amount of construction investment and operating expense, and therefore, there is also a disadvantage in that it is difficult for small and medium-sized enterprises to enter semiconductor manufacturing industry.

For the above reason, there is demanded a technology for performing the high-mix low-volume production of semiconductor devices at low cost, using a small-diameter semiconductor wafer and a small production device, at a small-scale production factory or the like.

Such a problem occurs, for example, for devices to produce electronic devices by processing sapphire substrates, aluminum substrates or the like, apparatuses to produce optical devices, and the like, as well as for semiconductor production devices.

The present invention has been made in view of such a problem, and has an object to provide a small production device and a production system at low cost.

Solution to Problem

A small production device according to the present invention includes: a processing chamber to perform an intended process for a processing substrate; a front chamber to perform loading and unloading of the processing substrate with the processing chamber, using a conveyance mechanism provided internally; a processing-chamber control unit provided in the processing chamber to control the process for the processing substrate in the processing chamber; and a front-chamber control unit provided in the front chamber to control the loading and unloading of the processing substrate between the processing chamber and the front chamber, in which the processing-chamber control unit sends a load request signal when a preparation of the process is completed, the load request signal requesting, to the front-chamber control unit, the loading of the processing substrate from the front chamber to the processing chamber, starts the process when a load acknowledgment signal is received from the front-chamber control unit, the load acknowledgment signal indicating that the loading of the processing substrate is completed, sends an unload request signal when the process is completed, the unload request signal requesting, to the front-chamber control unit, the unloading of the processing substrate from the processing chamber to the front chamber, and starts the preparation of the process when an unload acknowledgment signal is received from the front-chamber control unit, the unload acknowledgment signal indicating that the unloading of the processing substrate is completed, and the front-chamber control unit starts a loading behavior for the processing substrate when the load request signal is received from the processing-chamber control unit, sends the load acknowledgment signal to the processing-chamber control unit when the loading behavior for the processing substrate is completed, starts an unloading behavior for the processing substrate when the unload request signal is received from the processing-chamber control unit, and sends the unload acknowledgment signal to the processing-chamber control unit when the processing substrate is unloaded from the processing chamber.

In the small production device according to the present invention, it is preferable that the front chamber further include a loading port to be opened at time of performing the loading and unloading of the processing substrate to the processing chamber, and the front-chamber control unit further perform a control of a behavior of opening the loading port when the load request signal is received from the processing-chamber control unit, and further perform a control of a behavior of closing the loading port when the unload request signal is received from the processing-chamber control unit.

A production system according to the present invention is a production system including a plurality of the above small production devices of the present invention, in which any one or more small production devices are different in configuration of the processing chamber, and all small production devices are identical to each other in configuration of the front chamber.

Advantageous Effects of Invention

According to the small production device of the present invention, the processing chamber and the front chamber are controlled separately and independently, using the processing-chamber control unit and the front-chamber control unit, and the process preparing state/conveying state/processing state of the small production device are switched at the timings to send and receive the load request signal, the load acknowledgment signal, the unload request signal and the unload acknowledgment signal between the processing-chamber control unit and the front-chamber control unit.

Therefore, in the small production device of the present invention, it is hardly necessary to consider the control of the front-chamber control unit, in the development of a control program of the processing-chamber control unit, and therefore, it is possible to reduce the development cost of the small production device, compared to the case where the whole of a small production device is controlled by a single control means.

Furthermore, according to the small production device of the present invention, the control signals to be sent and received between the processing-chamber control unit and the front-chamber control unit are simple, and therefore, it is possible to simplify the interface between the processing-chamber control unit and the front-chamber control unit. Also in this respect, it is possible to reduce the development cost and production cost of the small production device.

Further, according to the production system of the present invention, in each small production device, it is possible to control the processing chamber and the front chamber almost independently, and thereby, it is possible to make the control of the front chamber common, regardless of the kind of the small production device (that is, the kind of the process to be performed for the processing substrate). Therefore, it is hardly necessary to consider the control content and others of the front chamber, in the development of the control program of each small production device, and accordingly, it is possible to reduce the development cost.

BRIEF DESCRIPTION OF DRAWINGS

FIG. 2 is a block diagram schematically showing a control system of a small semiconductor production devices according to the embodiment.

DESCRIPTION OF EMBODIMENTS

[Embodiment 1 of the Invention]

Hereinafter, an embodiment 1 of the present invention will be described, taking as an example the case of applying the present invention to a small semiconductor production devices.

Figure 1:
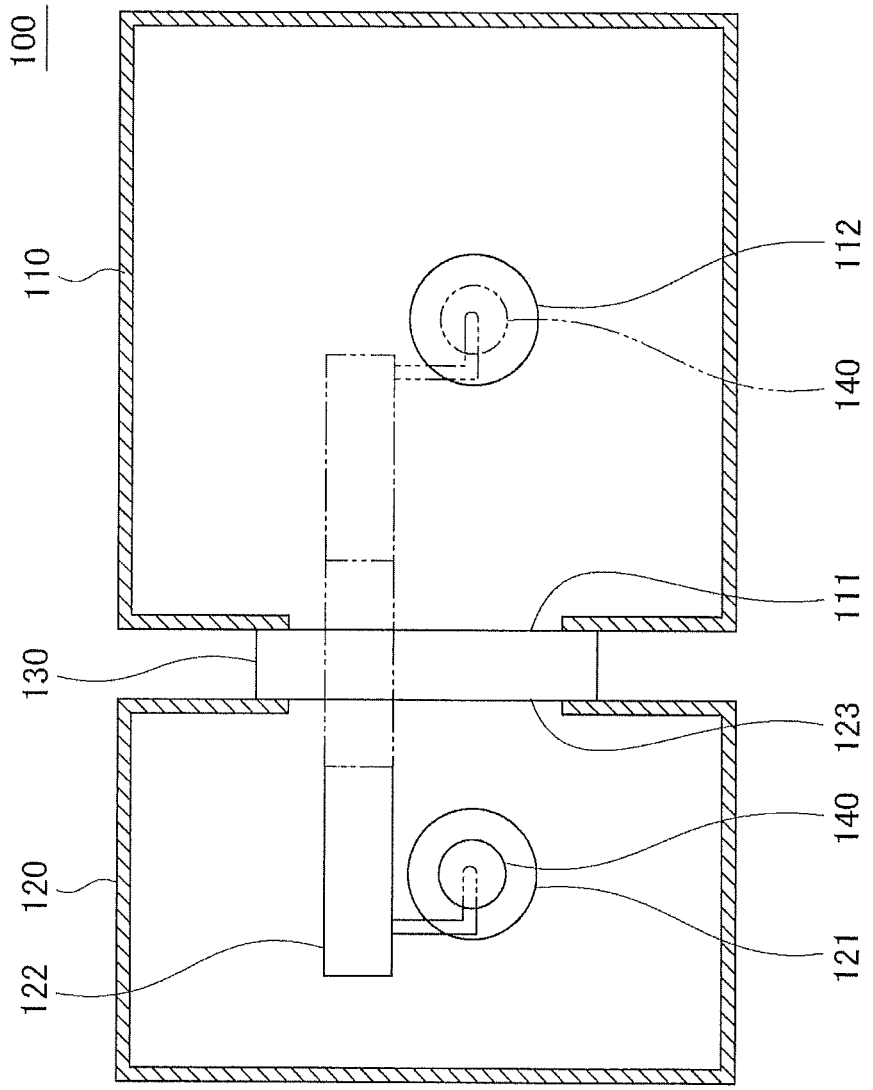
FIG. 1 is a plan view schematically showing the configuration of a small production device according to an embodiment.

FIG. 1 is a plan view schematically showing the configuration of a small semiconductor production devices according to the embodiment 1. Further, FIG. 2 is a block diagram conceptually showing a control system of a small semiconductor production devices 100.

In the embodiment 1, in the case of constructing a semiconductor production system using a plurality of the small semiconductor production devices 100 (see FIG. 2), front chambers having an identical structure are used as front chambers 120 of each small semiconductor production devices 100.

As shown in FIG. 1, each of the small semiconductor production devices 100 includes a processing chamber 110, the front chamber 120, and a gate valve 130 (corresponding to the loading port in the present invention). Here, in the embodiment, as described later, the gate valve 130 is provided in the front chamber 120.

The processing chamber 110 is a chamber for performing an intended process (a film formation process, an etching process, an inspection process or the like) for a semiconductor wafer 140. The processing chamber 110 is provided with a loading gate 111 for loading the semiconductor wafer 140 from the front chamber 120. Further, the processing chamber 110 is provided with a wafer stage 112 on which the semiconductor wafer 140 is mounted, a processing mechanism (not illustrated) that performs the intended process for the semiconductor wafer 140 mounted on the wafer stage 112, and the like. The detailed description of the process for the semiconductor wafer 140 is omitted. Here, in the case of constructing a semiconductor production system using the plurality of small semiconductor production devices 100, the processing chambers 110 of each of the small semiconductor production devices 100 are typically different from each other in process content and device structure.

The front chamber 120 is a chamber for taking in the semiconductor wafer 140 from the exterior and conveying it to the processing chamber 110. The front chamber 120 is provided with a wafer stage 121 on which the semiconductor wafer 140 taken in from the exterior is mounted, a conveyance mechanism 122 that conveys the semiconductor wafer 140 mounted on the wafer stage 121 to the wafer stage 112 of the processing chamber 110 and mounts it, a gate valve 130, and the like. Further, the front chamber 120 is provided with an unloading gate 123 for conveying the semiconductor wafer 140 to the processing chamber 110. Here, the front chamber 120 is further provided with a mechanism for loading the semiconductor wafer 140 from the exterior, a loading gate, and the like, and the structures, positions and others thereof are arbitrary (not illustrated).

The gate valve 130 is provided between the loading gate 111 and the unloading gate 123. As described later, the gate valve 130 is opened when the semiconductor wafer 140 is conveyed between the processing chamber 110 and the front chamber 120, and is closed when the process for the semiconductor wafer 140 is performed in the processing chamber 110.

As shown in FIG. 2, the processing chamber 110 is provided with a processing-chamber operation unit 113, a processing-chamber control unit 114, a processing-chamber power supply unit 115, and the like.

As the processing-chamber operation unit 113, an operation substrate connected with a switch, a touch panel and the like for manually operating the processing chamber 110 can be used. Here, as the processing-chamber operation unit 113, an external operation apparatus (for example, personal computer, a dedicated operation terminal and the like) may be used.

The processing-chamber control unit 114 executes the process for the semiconductor wafer 140 (see FIG. 1), based on an operation signal and the like input from the processing-chamber operation unit 113.

Further, the processing-chamber control unit 114 sends the following signals to a front-chamber control unit 125 in parallel.

(1) Processing-chamber normal behavior signal NORM_PROCESS: a signal indicating that the processing chamber 110 is normally behaving (2) Load request signal REQ_LOAD: a signal requesting the loading of the semiconductor wafer 140 from the front chamber 120 to the processing chamber 110

(3) Unload request signal REQ_UNLOAD: a signal requesting the unloading of the semiconductor wafer 140 from the processing chamber 110 to the front chamber 120

The processing-chamber power supply unit 115 supplies the electric power supplied from the exterior, to the processing-chamber operation unit 113, the processing-chamber control unit 114, the process mechanism (not illustrated), which actually performs the process for the semiconductor wafer 140, and the like. Furthermore, the processing-chamber power supply unit 115 also supplies the electric power to the front chamber 120. Here, the power supply unit 115 is turned on/off by a front-chamber operation unit 124 (described later).

Here, in the case of constructing a semiconductor production system using the plurality of small semiconductor production devices 100, the process contents and device structures of each processing chambers 110 are typically different (described above), and therefore, the controls of the processing-chamber operation units 113 and the processing-chamber control units 114 are also different mutually. However, since the front chambers 120 are made common, the signal forms and output conditions of the above signals NORM_PROCESS, REQ_LOAD, REQ_UNLOAD are made common.

On the other hand, as shown in FIG. 2, the front chamber 120 is provided with the front-chamber operation unit 124, a front-chamber control unit 125, a power supply unit 126, and the like.

The front-chamber operation unit 124 is provided with a switch and the like for manually operating the front chamber 120. Furthermore, the front-chamber operation unit 124 includes indicating lamps to indicate the operational states (working state/stop state, normal/abnormal) of the processing chamber 110 and the front chamber 120, an operation switch for performing the emergency stop of the front chamber 120 and the processing chamber 110, a power supply switch for turning the power supply units 115, 126 on/off, and the like.

The front-chamber control unit 125 performs a control to load the semiconductor wafer 140 from the exterior into the front chamber 120, and a control to take out it from the front chamber 120 to the exterior. In addition, the front-chamber control unit 110 performs the loading and unloading of the semiconductor wafer 140 between the exterior and the front chamber 120, based on the above signals NORM_PROCESS, REQ_LOAD, REQ_UNLOAD input from the front-chamber operation unit 124. Further, the front-chamber control unit 125 sends the following signals to the processing-chamber control unit 114 in parallel.

(4) Front-chamber normal behavior signal NORM_PORT: a signal indicating that the front-chamber 120 is normally behaving (5) Transition request signal AUTO: a signal requesting the transition into an automatic mode, to the processing chamber 110

(6) Load acknowledgment signal ACK_LOAD: a signal permitting the processing chamber 110 to start the process, when the loading of the semiconductor wafer 140 to the processing chamber 110 is completed (7) Unload acknowledgment signal ACK_UNLOAD: a signal permitting the processing chamber 110 to start the preparation of the next process, when the unloading of the semiconductor wafer 140 from the processing chamber 110 is completed The front-chamber power supply unit 126 supplies the electric power supplied from the processing-chamber power supply unit 115, to the front-chamber operation unit 124, the front-chamber control unit 125, the conveyance mechanism 122 (see FIG. 1), and the like.

Here, as described above, even in the case of constructing a semiconductor production system using the plurality of small semiconductor production devices 100, the front chambers 120 are made common.

A centralized management unit 150 centrally manages the work states of the plurality of small semiconductor production devices 100 provided in the semiconductor production system according to the embodiment 1. Therefore, the centralized management unit 150 is connected with the processing-chamber control unit 114 and the front-chamber control unit 125 of each small semiconductor production devices 100, for example, through Ethernet (Registered Trademark). Further, in the case of intending to update a program or setting parameter of each small semiconductor production devices 100, a new program or the like may be sent from the centralized management unit 150 to each small semiconductor production devices 100.

Figure 3A:
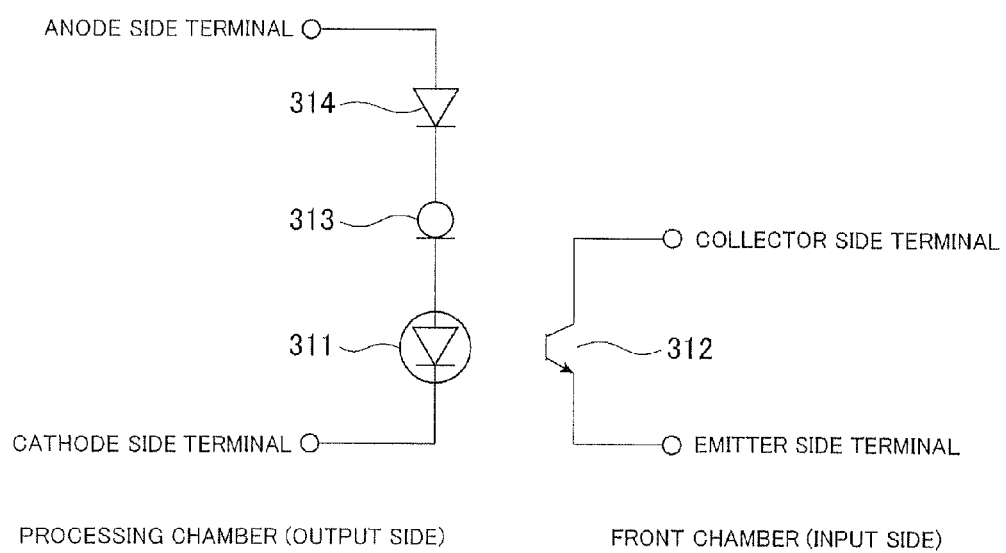
FIG. 3A is a circuit diagram of an interface for signals to be sent from a processing chamber to a front chamber according to the embodiment.
Figure 3B:
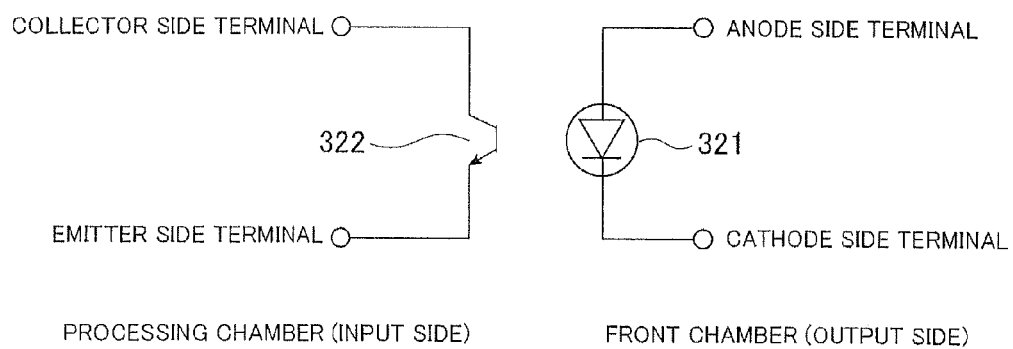
FIG. 3B is a circuit diagram of an interface for signals to be sent from the front chamber to the processing chamber according to the embodiment.

FIG. 3A and FIG. 3B are circuit diagrams showing the configuration examples of signal interfaces according to the embodiment 1, in which FIG. 3A shows an interface for the signals NORM_PROCESS, REQ_LOAD, REQ_UNLOAD to be sent from the processing chamber 110 to the front chamber 120, and FIG. 3B shows an interface for the signals NORM_PORT, RESET_PROCESS, AUTO, ACK_LOAD, ACK_UNLOAD to be sent from the front chamber 120 to the processing chamber 110.

As shown in FIG. 3A and FIG. 3B, in the embodiment 1, photo-couplers are used as the signal interfaces.

As shown in FIG. 3A, in a photo-coupler for a signal to be output by the processing chamber 110, a light-emitting element 311 is disposed on the side of the processing chamber 110, and a light-receiving element 312 is disposed on the side of the front chamber 120. It is preferable that a current regulative diode 313 for overcurrent prevention, a diode 314 for protecting the photo-coupler in the case of being reversely connected, and the like be connected in series with an anode of the light-emitting element 311. Such a photo-coupler is provided for each of the signals NORM_PROCESS, REQ_LOAD, REQ_UNLOAD.

As shown in FIG. 3B, in a photo-coupler for a signal to be output by the front chamber 120, a light-emitting element 322 is disposed on the side of the front chamber 120, and a light-receiving element 321 is disposed on the side of the processing chamber 110. Such a photo coupler is provided for each of the signals NORM_PORT, RESET_PROCESS, AUTO, ACK_LOAD, ACK_UNLOAD.

In the embodiment 1, the signals to be sent and received between the processing-chamber control unit 114 and the front-chamber control unit 125 are just the signals for performing the transition of the process preparing state/ conveying state/processing state of the processing chamber 110. That is, the precise behavior such as the conveyance of the semiconductor wafer 140 is controlled by the front-chamber control unit 125 alone, and do not require the involvement of the processing-chamber control unit 114. Therefore, it is possible to synchronize the behavior of the processing-chamber control unit 114 and the behavior of the front-chamber control unit 125, using only the simple interfaces with use of the photo-couplers and the like.

Figure 4:
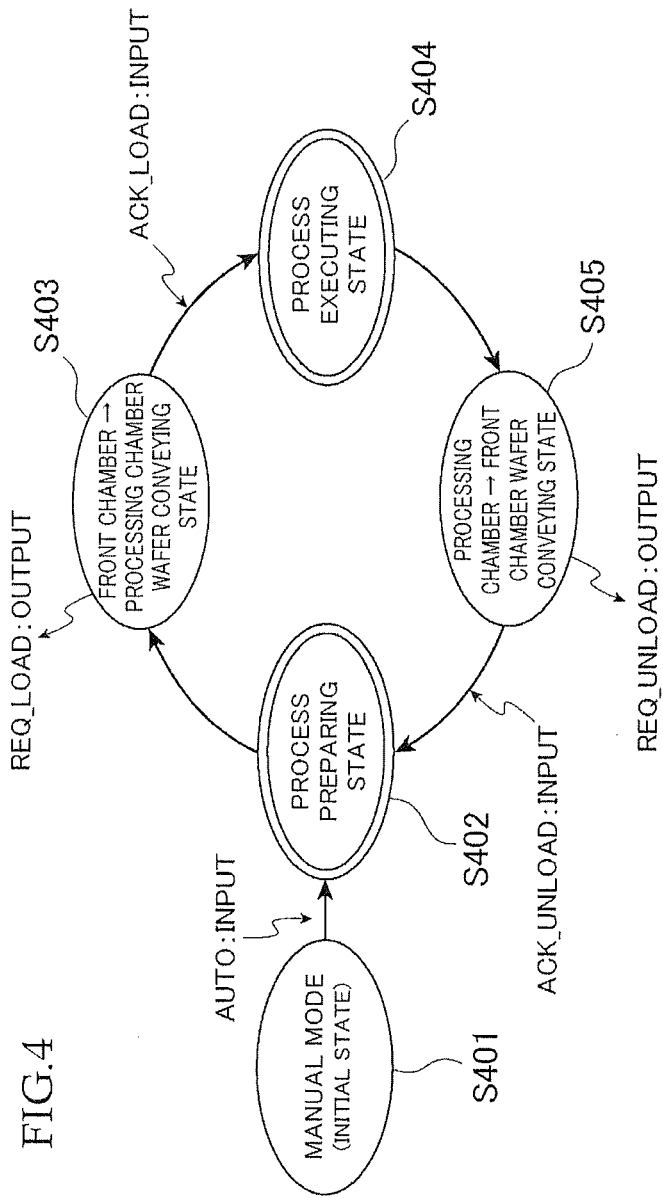
FIG. 4 is a state transition diagram for describing the behavior of the processing chamber of the small production device according to the embodiment.

Next, the behavior of the small semiconductor production devices 100 according to the embodiment 1 will be described. FIG. 4 is a state transition diagram for describing the behavior of the processing chamber of the small production device according to the embodiment 1, and FIG. 5 is a state transition diagram for describing the behavior of the front chamber of the small production device according to the embodiment.

Figure 5:
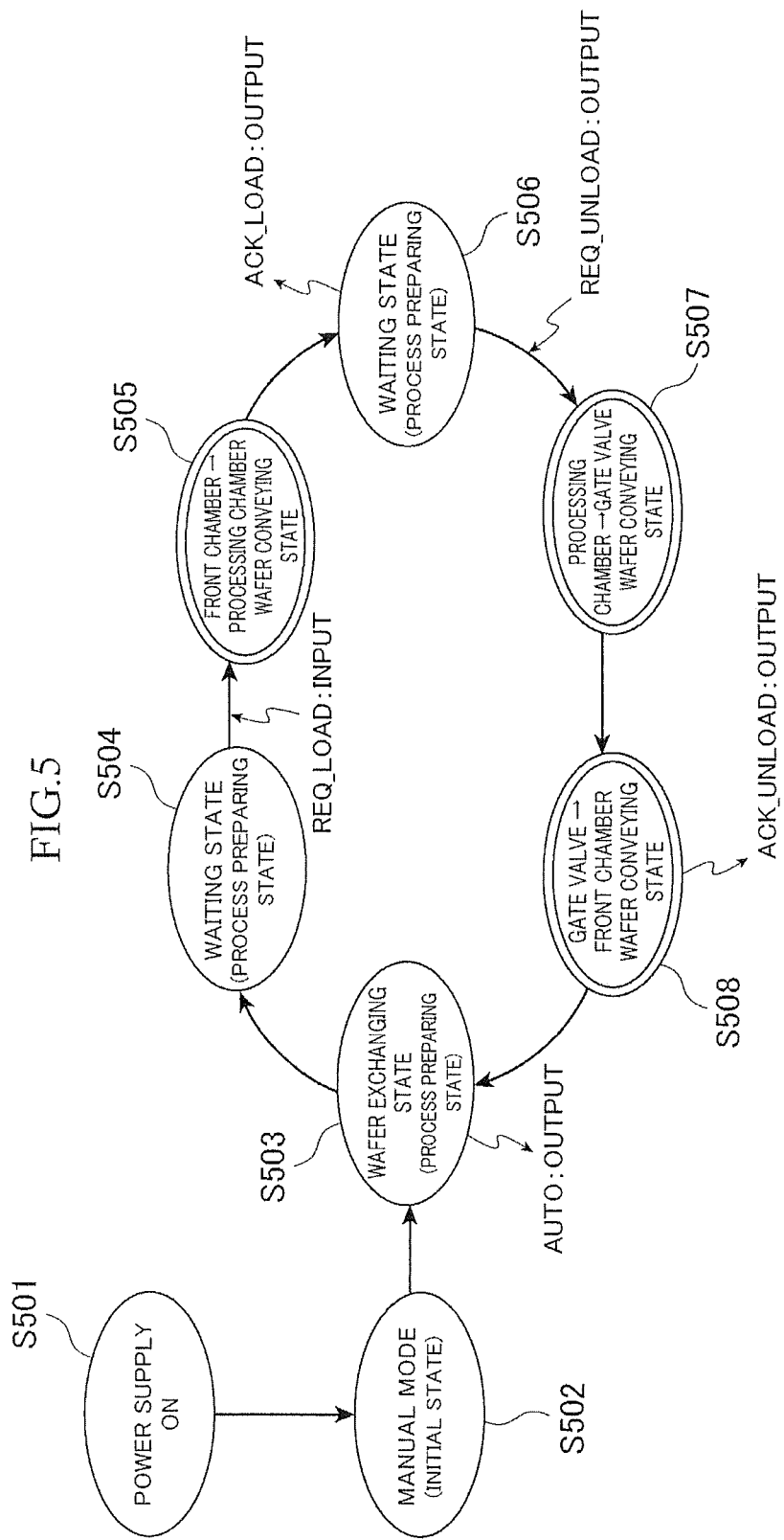
FIG. 5 is a state transition diagram for describing the behavior of the front chamber of the small production device according to the embodiment.

First, an operator operates the power supply switch (not illustrated) of the front-chamber operation unit 124, so that the power supply units 115, 126 of the processing chamber 110 and the front chamber 120 are turned on (S501 in FIG. 5). When the power supply unit 115 of the processing chamber 110 is turned on, the processing-chamber control unit 114 turns the processing-chamber normal behavior signal NORM_PROCESS on. Further, when the power supply unit 126 of the front chamber 120 is turned on, the front-chamber control unit 125 turns the front-chamber normal behavior signal NORM_PORT on. When the power supply units 115, 126 are on, each of the processing chamber 110 and the front chamber 120 is set to a manual mode (S401 in FIG. 4, S502 in FIG. 5).

Next, when the operator switches the switch of the front-chamber operation unit 124 to the automatic mode, the front-chamber control unit 125 transits into the automatic mode, and outputs the transition request signal AUTO. As described above, the transition request signal AUTO is a signal requesting the transition into the automatic mode, to the processing chamber 110. When the transition request signal AUTO is input, the processing-chamber control unit 114 transits into the automatic mode, and starts the preparation of the process (see S402 in FIG. 4). As described above, the process of the processing chamber 110 is different for each small semiconductor production devices 100, and therefore, the content of the process preparation is also different for each small semiconductor production devices 100.

After the transition into the automatic mode, the front-chamber control unit 125 performs the control to load the semiconductor wafer 140 from the exterior into the front chamber 120 (S503 in FIG. 5). As described above, the mechanism for loading the semiconductor wafer 140 from the exterior into the front chamber 120 is arbitrary, and therefore, the detailed description of the control is also omitted. When the loading of the semiconductor wafer 140 is completed, the front-chamber control unit 125 waits as it is (S504 in FIG. 5).

When the process preparation is completed, the processing chamber 110 outputs the load request signal REQ_LOAD.

When the load request signal REQ_LOAD is input, the front-chamber control unit 125 starts the control to convey the semiconductor wafer 140 from the front chamber 120 to the processing chamber 110 (S403 in FIG. 4, 5505 in FIG. 5). In the control, the gate valve 130 is opened, the semiconductor wafer 140 on the wafer stage 121 is held by the conveyance mechanism 122 in the front chamber 120, and by the extension of the conveyance mechanism 122, the semiconductor wafer 140 is loaded into the processing chamber 110. Then, after the semiconductor wafer 140 is mounted on the wafer stage 112, the conveyance mechanism 122 is shrank and retracted from the processing chamber 110, the gate valve 130 is closed, and thereby, the load control is completed. Thereafter, the front-chamber control unit 125 outputs the load acknowledgment signal ACK_LOAD, and enters a waiting state (S506 in FIG. 5).

When the load acknowledgment signal ACK_LOAD is input, the processing chamber 110 executes the process for the semiconductor wafer 140 (S404 in FIG. 4). Then, when the process is completed, the unload request signal REQ_UNLOAD is output.

When the unload request signal REQ_UNLOAD is input, the front-chamber control unit 125 starts the control to unload the semiconductor wafer 140 from the processing chamber 110 to the front chamber 120 (S405 in FIG. 4, 5507 in FIG. 5). In the control, first, the gate valve 130 is opened, the conveyance mechanism 122 of the front chamber 120 is extended to the processing chamber 110, and the semiconductor wafer 140 on the wafer stage 112 is held by the conveyance mechanism 122. Then, the conveyance mechanism 122 is shrank and retracted, and when the conveyance mechanism 122 and the semiconductor wafer 140 completely exit from the processing chamber 110, the front-chamber control unit 125 closes the gate valve 130, and outputs the unload acknowledgment signal ACK_UNLOAD. Thereafter, the semiconductor wafer 140 is placed on the wafer stage 121, and the unload control is completed (S508 in FIG. 5). Then, the front-chamber control unit 125 performs the control to unload the processed semiconductor wafer 140 to the exterior, and the control to loading the next semiconductor wafer 140 from the exterior into the front chamber 120 (S503 in FIG. 5).

On the other hand, when the unload acknowledgment signal ACK_UNLOAD is input, the processing chamber 110 starts the process preparation for the next semiconductor wafer 140 (S402 in FIG. 4).

As described above, in the embodiment 1, the processing chamber 110 and the front chamber 120 are controlled separately and independently, by the processing-chamber control unit 113 and the front-chamber control unit 124, and the load request signal REQ_LOAD, the load acknowledgement signal ACK_LOAD, the unload request signal REQ_UNLOAD and the unload acknowledgement signal ACK_UNLOAD are sent and received between the processing-chamber control unit 114 and the front-chamber control unit 125. Then, thereby, it is possible to specify the timings to switch the process preparing state/conveying state/processing state of the processing chamber 110, and it is possible to synchronize the behavior of the front chamber 120 with the transition.

Accordingly, in the small semiconductor production devices 100 according to the embodiment 1, it is hardly necessary to consider the control of the front-chamber control unit 125, in the development of the control program of the processing-chamber control unit 114, and therefore, it is possible to reduce the development cost of the small semiconductor production devices 100, compared to the case where the whole of the small semiconductor production devices 100 is controlled by a single control means.

Furthermore, according to the small semiconductor production devices 100 of the present invention, it is possible to simplify the control signals to be sent and received between the processing-chamber control unit 114 and the front-chamber control unit 125, and therefore, it is possible to simplify the interface between the processing-chamber control unit 113 and the front-chamber control unit 124. Also in this respect, it is possible to reduce the development cost and production cost of the small semiconductor production devices 100.

Further, according to the production system of the present invention, in each small semiconductor production devices 100, it is possible to control the processing chamber 110 and the front chamber 120 almost independently, and thereby, it is possible to make the control of the front chamber 120 common, regardless of the kind of the small semiconductor production devices 100 (that is, the kind of the process to be performed for the semiconductor wafer 140). Therefore, it is hardly necessary to consider the control content of the front chamber 120, in the development of the control program of each small production device 100, and accordingly, it is possible to reduce the development cost.

The invention claimed is:

1. A small production device comprising:
 a processing chamber to perform an intended process for a processing substrate;
 a front chamber to perform loading and unloading of the processing substrate with the processing chamber, using a conveyance mechanism provided internally;
 a processing-chamber control unit provided in the processing chamber to control the process for the processing substrate in the processing chamber; and
 a front-chamber control unit provided in the front chamber to control the loading and unloading of the processing substrate between the processing chamber and the front chamber,
 wherein the processing-chamber control unit
 sends a load request signal when a preparation of the process is completed, the load request signal requesting, to the front-chamber control unit, the loading of the processing substrate from the front chamber to the processing chamber,
 starts the process when a load acknowledgment signal is received from the front-chamber control unit, the load acknowledgment signal indicating that the loading of the processing substrate is completed,
 sends an unload request signal when the process is completed, the unload request signal requesting, to the front-chamber control unit, the unloading of the processing substrate from the processing chamber to the front chamber, and
 starts the preparation of the process when an unload acknowledgment signal is received from the front-chamber control unit, the unload acknowledgment signal indicating that the unloading of the processing substrate is completed, and
 the front-chamber control unit
 starts a loading behavior for the processing substrate when the load request signal is received from the processing-chamber control unit,
 sends the load acknowledgment signal to the processing-chamber control unit when the loading behavior for the processing substrate is completed,
 starts an unloading behavior for the processing substrate when the unload request signal is received from the processing-chamber control unit, and
 sends the unload acknowledgment signal to the processing-chamber control unit when the processing substrate is unloaded from the processing chamber.

2. The small production device according to claim 1, wherein the front chamber further comprises a loading port to be opened at time of performing the loading and unloading of the processing substrate to the processing chamber, and
 the front-chamber control unit
 further performs a control of a behavior of opening the loading port when the load request signal is received from the processing-chamber control unit, and
 further performs a control of a behavior of closing the loading port when the unload request signal is received from the processing-chamber control unit.

3. A production system comprising a plurality of the small production devices according to claim 1 or 2,
 wherein any one or more small production devices are different in configuration of the processing chamber, and all the small production devices are identical to each other in configuration of the front chamber.

* * * * *

UNITED STATES PATENT AND TRADEMARK OFFICE
CERTIFICATE OF CORRECTION

PATENT NO. : 9,478,452 B2  Page 1 of 1
APPLICATION NO. : 14/768352
DATED : October 25, 2016
INVENTOR(S) : Shiro Hara et al.

It is certified that error appears in the above-identified patent and that said Letters Patent is hereby corrected as shown below:

In the Claims

Column 10, Line 36, Claim 3:
After "1" delete "or 2", therefor.

Signed and Sealed this
Third Day of January, 2017

Michelle K. Lee
*Director of the United States Patent and Trademark Office*